United States Patent
Yamauchi

(10) Patent No.: US 10,068,659 B2
(45) Date of Patent: Sep. 4, 2018

(54) SEMICONDUCTOR MEMORY DEVICE AND PROGRAMMING METHOD OF NAND FLASH MEMORY

(71) Applicant: Winbond Electronics Corp., Taichung (TW)

(72) Inventor: Kazuki Yamauchi, Saitama (JP)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 14/642,391

(22) Filed: Mar. 9, 2015

(65) Prior Publication Data
US 2015/0261605 A1    Sep. 17, 2015

(30) Foreign Application Priority Data
Mar. 14, 2014 (JP) .................. 2014-051227

(51) Int. Cl.
  *G11C 29/52* (2006.01)
  *G06F 11/10* (2006.01)
  (Continued)

(52) U.S. Cl.
  CPC .......... *G11C 29/52* (2013.01); *G06F 11/1048* (2013.01); *G06F 3/0679* (2013.01);
  (Continued)

(58) Field of Classification Search
  CPC ..... G11C 29/52; G11C 11/5628; G11C 16/10; G11C 2029/0411; G06F 11/10;
  (Continued)

(56) References Cited

U.S. PATENT DOCUMENTS 4,890,287 A * 12/1989 Johnson ............... H03M 13/15
                                                         360/48

2003/0043634 A1 * 3/2003 Miyauchi ............... G11C 16/08
                                                         365/185.29
(Continued)

FOREIGN PATENT DOCUMENTS

| JP | 2006209969 A | 8/2006 |
|---|---|---|
| JP | 2008-165805 | 7/2008 |
| JP | 2010-079486 | 4/2010 |
| JP | 2010-152989 | 7/2010 |
| KR | 10-1994-0004820 A | 3/1994 |
| WO | WO2011/116454 A1 | 9/2011 |

OTHER PUBLICATIONS

Japanese Office Action dated Apr. 28, 2015, as issued in corresponding Japan Patent Application No. 2014-051227 with English translation (7 pages).
(Continued)

*Primary Examiner* — April Ying Shan Blair
*Assistant Examiner* — Sazzad Hossain
(74) *Attorney, Agent, or Firm* — Muncy, Geissler, Olds & Lowe, P.C.

(57) ABSTRACT

The invention provides a semiconductor memory device capable of maintaining data reliability and shortening programming time. A flash memory of the invention includes a memory array 100, a page buffer/sensor circuit 160, an input/output buffer 110 connected to an external input/output terminal, and an ECC circuit 120 for checking and correcting data errors. In a programming operation, the input/output buffer 110 loads programming data into the page buffer/sensor circuit 160 and the ECC circuit 120 in parallel. The ECC circuit 120 writes parity bits generated from ECC calculation into a spare domain of the page buffer/sensor circuit 160. After the ECC procedure, the data held by the page buffer/sensor circuit 160 are programmed to a selected page.

9 Claims, 8 Drawing Sheets

(51) Int. Cl.
  *G06F 3/06* (2006.01)
  *G06F 11/00* (2006.01)
  *G11C 16/10* (2006.01)
  *G11C 11/56* (2006.01)
  *G11C 29/04* (2006.01)

(52) U.S. Cl.
  CPC ............ *G06F 3/0688* (2013.01); *G06F 11/00* (2013.01); *G06F 11/10* (2013.01); *G06F 11/1052* (2013.01); *G06F 11/1068* (2013.01); *G06F 2212/2022* (2013.01); *G06F 2212/214* (2013.01); *G06F 2212/222* (2013.01); *G06F 2212/403* (2013.01); *G11C 11/5628* (2013.01); *G11C 16/10* (2013.01); *G11C 2029/0411* (2013.01)

(58) Field of Classification Search
  CPC .... G06F 11/1068; G06F 3/0679; G06F 11/00; G06F 11/1052; G06F 2212/2022; G06F 2212/214; G06F 2212/222; G06F 2212/403; G06F 3/0688; G06G 11/1048
  USPC ................ 714/763, 764, 766, 773
  See application file for complete search history.

(56) References Cited

U.S. PATENT DOCUMENTS

| | | | | |
|---|---|---|---|---|
| 2008/0184094 | A1* | 7/2008 | Murray | G06F 11/1072 714/763 |
| 2009/0319871 | A1* | 12/2009 | Shirai | G06F 11/1068 714/773 |
| 2010/0162081 | A1* | 6/2010 | Joo | G06F 11/1048 714/763 |

OTHER PUBLICATIONS

Japanese Office Action dated Nov. 17, 2015, as issued in corresponding Japan Patent Application No. 2014-051227 with English translation (7 pages).

Korean Office Action dated Jan. 11, 2016, as issued in corresponding Korea Patent Application No. 10-2014-0156192 with English translation (10 pages).

Taiwanese Office Action dated Jan. 19, 2016, as issued in corresponding Taiwan Patent Application No. 103135458 with Partial English translation (8 pages).

* cited by examiner

| | Erase | Write-in | Readout |
|---|---|---|---|
| selected W/L | 0 | 15~20V | 0 |
| non-selected W/L | F | 10V | 4.5 |
| SGD | F | Vcc | 4.5 |
| SGS | F | 0 | 4.5 |
| SL | F | Vcc | 0 |
| P well | 21 | 0 | 0 |

SEMICONDUCTOR MEMORY DEVICE AND PROGRAMMING METHOD OF NAND FLASH MEMORY

CROSS REFERENCE TO RELATED APPLICATIONS

This Application claims priority of Japanese Patent Application No. 2014-051227, filed on Mar. 14, 2014, the entirety of which is incorporated by reference herein.

BACKGROUND OF THE INVENTION

Field of the Invention

The present invention relates to error checking and correcting of input/output data of a semiconductor memory device, and in particular to error checking, correcting and programming of input/output data of a NAND-type flash memory.

Description of the Related Art

Semiconductor memories, like flash memories, DRAMs, etc., have been increasing their integration level year after year, so it has become difficult to manufacture a memory element without defects. Therefore, a redundant scheme is utilized on the memory chip to compensate for physical defects of a memory element generated during the manufacturing process. For example, in a redundant scheme, a redundant memory is arranged to compensate for the memory elements with physical defects. In addition to physical compensation by a redundant memory, an ECC (Error Checking and Correcting) circuit is utilized on the semiconductor memory as a strategy for handling soft errors.

In a NAND-type flash memory, data is repeatedly programmed or erased, so the charge-holding characteristics become worse due to the deterioration of the tunnel insulation layer, or the threshold voltage is changed due to the charges trapped in the tunnel insulation layer. Those situations may cause bit errors. In Patent document 1, an ECC circuit is utilized as a strategy for handling those bit errors. Especially in the case of the memory cells which are near a block selection transistor, which have a tendency toward high bit error rates because of the variation of patterns formed by lithography or the variation of ion injection at the time the diffusion layer is formed. Thus, those memory cells store ECC codes to compensate for these kinds of bit errors as much as possible.

NAND-type flash memories include a species where a memory cell stores 1-bit data and a species where a memory cell stores multi-bit data. In Patent document 2, an error correction scheme for multi-bit data is disclosed. Patent document 3 further discloses a flash memory which attaches ECC parity to the input date to generate an ECC symbol, writes the generated ECC symbol into the physical block, corrects errors by the ECC symbol when there are errors in the page data read out from the physical block, treats the physical block of which the number of corrected errors is greater than a threshold value as a warning block, registers this physical block in a table, and lowers the priority of the warning block when data is written.

Patent document 1: Patent publication no. JP 2010-152989

Patent document 2: Patent publication no. JP 2008-165805

Patent document 3: Patent publication no. JP 2010-79486

FIG. 1 shows an example of a programming operation of a NAND-type flash memory which has a conventional ECC circuit integrated on the chip. The programming data input from the external input/output terminal is loaded into a page buffer/sense circuit 400. When the loading is finished, a transfer circuit 410 transfers the programming data held by the page buffer/sense circuit 400 to an ECC circuit 420. The transfer circuit 410 includes, for example, a plurality of transfer transistors capable of transferring data bi-directionally. Each transistor is driven by a control signal TC which is commonly supplied to each gate. The ECC circuit 420 performs an ECC calculation for the received data and generates error-correction symbols (error codes). The generated error-correction symbols are written back to a predetermined domain of the page buffer/sense circuit 400 by the ECC circuit 420. Then the page buffer/sense circuit 400 programs the input programming data and the error-correction symbols into a selected page in the memory array.

However, the transfer time of data from the page buffer/sense circuit 400 to the ECC circuit 420 may be relatively long. If the page buffer/sense circuit 400 uses "sector" as a unit of receiving data and the ECC circuit 420 performs an ECC calculation for the data in sector units, the programming data cannot be programmed until the transfer of all sectors of the page buffer/sense circuit 400 is finished. Furthermore, if the number of bits in a page increases due to high integration, the data transfer time and the time required for the calculation of the ECC circuit also increase proportionally. Therefore, the time required for programming the programming data into the memory array becomes longer.

To solve the above problems, the invention provides a semiconductor memory device capable of maintaining the reliability of data and accelerating the programming operation.

BRIEF SUMMARY OF THE INVENTION

A detailed description is given in the following embodiments with reference to the accompanying drawings.

A semiconductor memory device of the invention includes: a memory array, a data-holding element, an input element, an error checking and correcting element, a supply element, and a write-in element. The data-holding element holds the data read out from the memory array or the data to be written into the memory array. The error checking and correcting element performs error checking and correcting on the data. The supply element supplies the input data from the input element to the data-holding element and the error checking and correcting element in parallel. The write-in element writes error-correction symbols into the data-holding element. The error-correction symbols are generated by the fact that the error checking and correcting element processes the data from the supply element.

The semiconductor memory device also includes a programming element for programming the data held in the data-holding element into the memory array after the error-correction symbols are written into the data-holding element. When a programming operation is performed by the programming element, the supply element supplies the error checking and correcting element with the data input to the input element. When the data-holding element is divided into a plurality of sectors, the supply element supplies the data in sector units to the error checking and correcting element, and the error checking and correcting element performs error checking and correcting for the data in sector units. The semiconductor memory device also includes a data transfer element arranged between the data-holding element and the error checking and correcting element, wherein the data transfer element transfers the data held in the data-holding element to the error checking and correcting element when a readout operation is performed, and doesn't transfer the data held in the data-holding element to the error checking and correcting element when a programming operation is performed. The semiconductor memory device also includes a control element for controlling a programming operation and a readout operation according to an external command. The memory array is a NAND-type memory array.

A programming method of a NAND-type flash memory of the invention includes: loading programming data input from an external terminal into a page buffer and an error checking and correcting circuit in parallel; associating error-correction symbols generated by the error checking and correcting circuit with the programming data and writing them into the page buffer; and programming the programming data and the error-correction symbols held in the page buffer into a page selected in the memory array. The programming method further includes: determining whether an operation to be performed is a programming operation according to an external command, and when the operation to be performed is a programming operation, loading the programming data input from the external terminal to the error checking and correcting circuit.

According to the invention, the input data is loaded into the data-holding element and the error checking and correcting element in parallel, and then the error-correction symbols generated by the error checking and correcting element is written into the data-holding element. Therefore the transfer operation of the data from the data-holding element to the error checking and correcting element is unnecessary. The programming time can be shortened.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The embodiments will be described in detail in reference to the drawings. A NAND flash memory is taken as an example. Note that the drawings emphasize each element for easy understanding, so the drawings are different from the real devices in scale.

Figure 1:
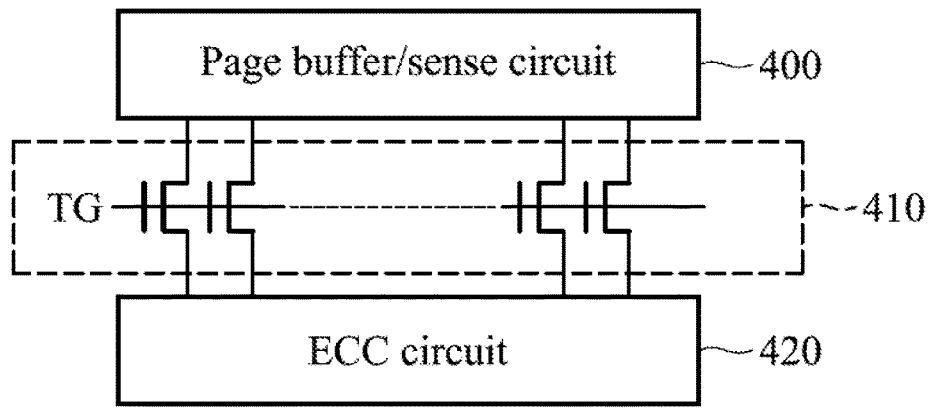
FIG. 1 is a diagram for illustrating the data input operation of a conventional NAND flash memory.
Figure 2:
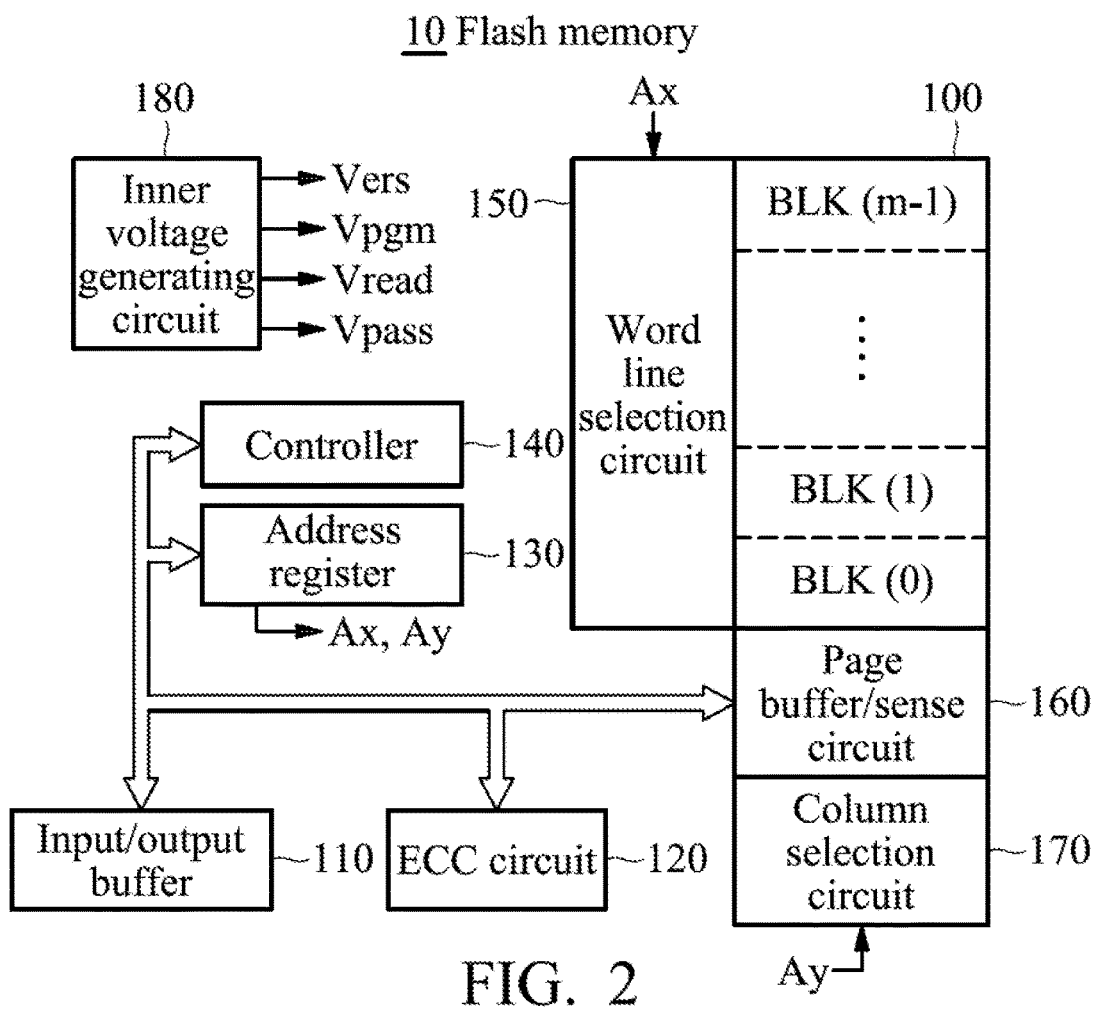
FIG. 2 is a diagram showing a typical configuration of a flash memory in accordance with an embodiment of the invention.

FIG. 2 shows a typical configuration of a flash memory in accordance with an embodiment of the invention. The flash memory shown here is just an example. The invention is not limited to this configuration. The flash memory 10 of the embodiment comprises: a memory array 100, formed from a plurality of memory cells arranged in rows and columns; an input/output buffer 110, connected to an external input/output terminal I/O and holds input/output data; an ECC circuit 120, performing error checking and correcting for the data programmed into the memory array and the data read out from the memory array 100; an address register 130, receiving address data from the input/output buffer 110; a controller 140, receiving command data from input/output buffer 110 or the and external control signals to control each portion; a word line selection circuit 150, decoding row address information Ax from the address register 130 and selecting a block and a word line according to the decode result; a page buffer/sense circuit 160, holding the date read out from pages selected by the word line selection circuit 150 and holding the data to be written into pages selected; a column selection circuit 170, decoding column address information Ay from the address register 130 and selecting data in the page buffer 160 according to the decode result; and an inner voltage generating circuit 180, generating necessary voltages used for reading out, programming, erasing data, etc. (such as a programming voltage Vpgm, a pass voltage Vpass, a read pass voltage Vread, an erasing voltage Vers, etc.).

The memory array 100 has m blocks BLK(0), BLK(1), . . . , BLK(m−1) arranged in columns. The page buffer/sense circuit 160 is arranged at a side close to the block BLK(0). However, the page buffer/sense circuit 160 can also be arranged at the other side of the blocks, or at both sides of the blocks.

Figures 3, 4:
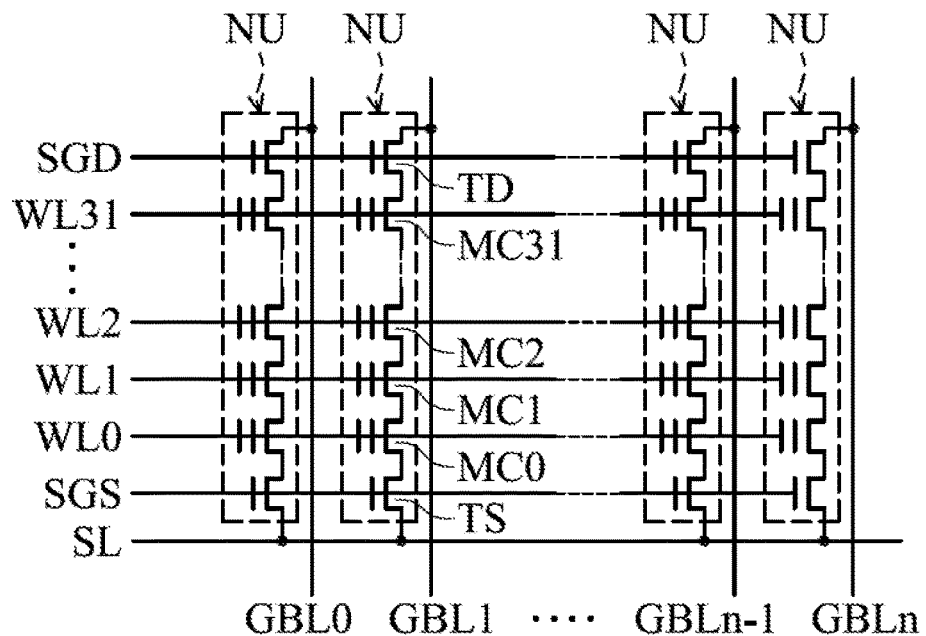
FIG. 3 is a circuit diagram showing a typical configuration of a NAND string of a memory array in accordance with an embodiment of the invention.
FIG. 4 is a table showing an example of bias voltages applied to each portion of a flash memory during each operation in accordance with an embodiment of the invention.

As shown in FIG. 3, a memory block is formed from a plurality of NAND string units NU, and each NAND string unit NU is formed by connecting a plurality of memory cells in series. A memory block has n+1 string units NU arranged in the row direction. The string unit NU comprises a plurality of memory cell MCi (I=0, 1, . . . , 31) connected in series, a bit line selection transistor TD connected to the drain of the memory cell MC31 located at one end, and a source line selection transistor TS connected to the source of the memory cell MC0 located at the other end. The drain of the bit line selection transistor TD is connected to a corresponding bit line GBL. The source of the source line selection transistor TS is connected to a common source line SL.

The control gate of the memory cell MCi is connected to a word line WLi. The gates of the bit line selection transistor TD and the source line selection transistor TS are connected to the selection gate lines SGD and SGS which are parallel with the word line WL. When selecting a memory block according to the row address Ax or a converted address, the word line selection circuit 150 selectively drives the bit line selection transistor TD and the source line selection transistor TS via the selection gate lines SGD and SGS of that block. FIG. 3 shows a typical configuration of a cell unit. The cell unit can include one or a plurality of dummy cells in the NAND string.

Typically, the memory cell has a MOS structure including: a source/drain which is an N-type diffusion region formed in a P well, a tunnel oxide film formed on the channel between the source and drain, a floating gate (electric charge accumulation layer) formed on the tunnel oxide film, and a control gate formed on the floating gate via a dielectric film. When there is no electric charge accumulated in the floating gate, namely, when data "1" is written in, the threshold value is negative and the memory cell is normally on. When there are electric charges accumulated in the floating gate, namely, when data "0" is written in, the threshold value becomes positive and the memory cell is normally off. However, the memory cell can be SLC type, which stores 1-bit, or MLC type, which stores multi-bits.

FIG. 4 is a table showing an example of bias voltages applied during each operation of the flash memory. In a readout operation, a positive voltage is applied to the bit line, a voltage (for example, 0V) is applied to the selected word line, a pass voltage Vpass (for example, 4.5V) is applied to the non-selected word line, a positive voltage (for example, 4.5V) is applied to the selection gate lines SGD and SGS, the bit line selection transistor TD and the source line selection transistor TS are turned on, and the common source line is supplied with 0V. In a programming (writing-in) operation, a high voltage which is a programming voltage Vpgm (for example, 15~20V) is applied to the selected word line, middle potential (for example, 10V) is applied to the non-selected word line, the bit line selection transistor TD is turned on, the source line selection transistor TS is turned off, and the bit line GBL is applied with potential corresponding to data "0" or data "1". In an erase operation, 0V is applied to the word lines selected in a block and a high voltage (for example, 20V) is applied to the P well to pull the electrons in the floating gate to the substrate. Thereby, data is erased in block units.

Figure 5:
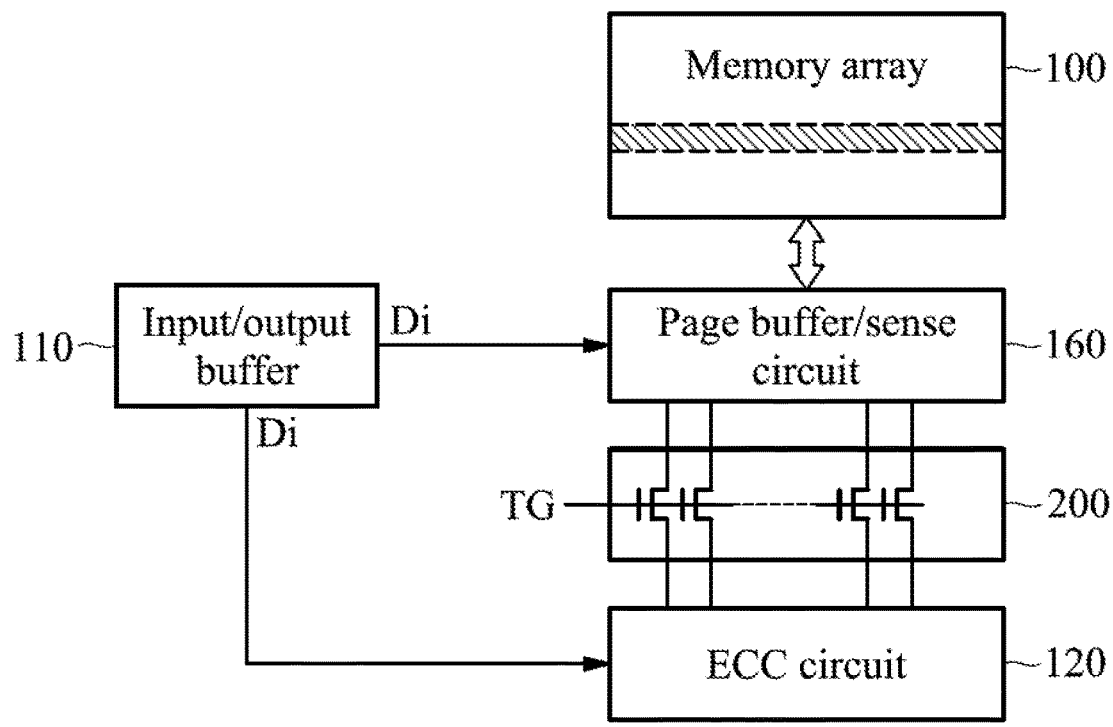
FIG. 5 is a diagram for illustrating a procedure of inputting data to a flash memory in accordance with an embodiment of the invention.

FIG. 5 shows a procedure of inputting data from the external input/output terminal of the flash memory 10 in accordance with the embodiment. In the programming operation, the input data supplied by the input/output buffer 110 is loaded into the page buffer/sense circuit 160 and the ECC circuit 120 in parallel.

The ECC circuit 120 calculates the input data Di to generate an error-correction symbol or a parity bit which is necessary for performing error checking and correcting for the input data Di. The ECC calculation is carried out by a well-known method such as Hamming codes or Reed-Solomon codes, to convert the input data Di of k bit or k bite to p=k+q. In this specification, q is called an error-correction symbol or a parity bit which is necessary for performing error checking and correcting for the input data Di. In a preferred example, the ECC circuit 120 can includes a write-in circuit which writes the error-correction symbol into the spare domain of the page buffer/sense circuit 160. However, this configuration is just an example. The invention is not limited thereto. For example, a write-in circuit for writing the error-correction symbol can be arranged separately from the ECC circuit 120, or be included in a transfer circuit 200.

The transfer circuit 200 is arranged between the page buffer/sense circuit 160 and the ECC circuit 120. The transfer circuit 200 includes a plurality of transfer transistors connected in parallel. The gate of each transfer transistor is commonly supplied with a driving signal TG. The driving signal TG is controlled by the controller 140. All of the transfer transistors can be turned on simultaneously by high level of the driving signal TG, so that data can be transferred bi-directionally between the page buffer/sense circuit 160 and the ECC circuit 120. Note that in this embodiment, the transfer circuit 200 makes it possible to transfer data bi-directionally between the page buffer/sense circuit 160 and the ECC circuit 120 during the readout operation, but the transfer circuit 200 does not transfer substantial programming data between the page buffer/sense circuit 160 and the ECC circuit 120 during the programming operation.

Figure 6:
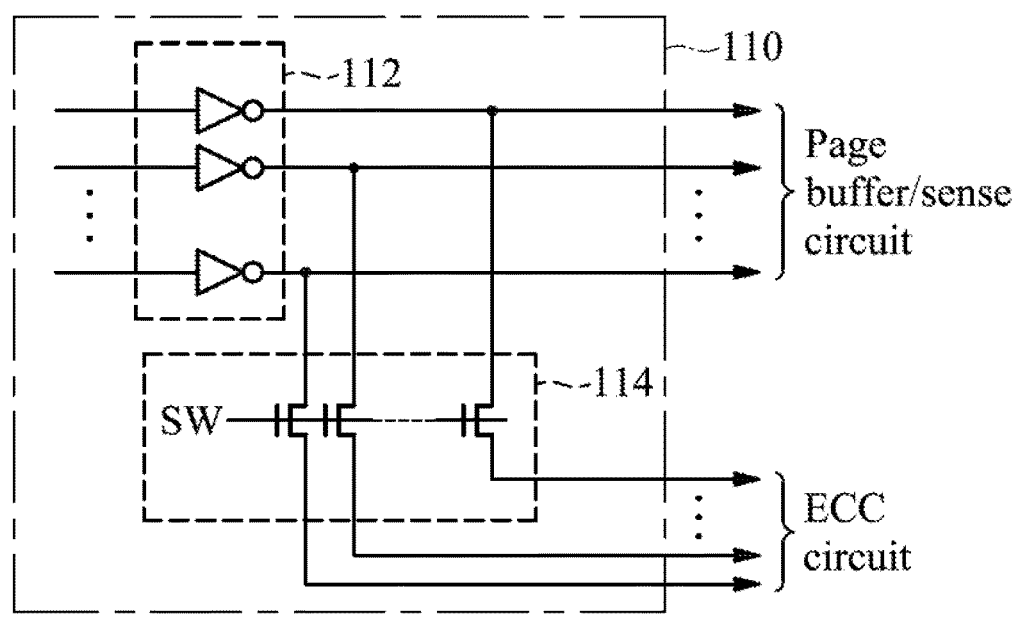
FIG. 6 is a diagram showing an example of an input/output buffer of a memory array in accordance with an embodiment of the invention.

In the programming operation, the input data Di from the input/output buffer 110 is supplied to the page buffer/sense circuit 160 and the ECC circuit 120 respectively. FIG. 6 shows an example of an inner configuration of a portion of the input/output buffer 110. The input/output buffer 110 includes a plurality of output buffers 112, and a switch circuit 114 connected to each output terminal of the plurality of output buffers 112. The switch circuit 114 includes a plurality of transistors. Regarding each one of the transistors, one terminal is connected to one of the output buffers 112, the other terminal is connected to the ECC circuit 120, and the gate is supplied with a switch signal SW. The switch signal SW is controlled by the controller 140. Namely, when the programming command input from the outside is interpreted by the controller 140, the switch signal is driven to high level to turn on all of the transistors together. The input data Di from the output buffers 112 is also supplied to the ECC circuit 120. Anytime other than the programming operation, the switch signal SW is driven to low level so as to isolate the output buffers 112 from the ECC circuit 120.

The transfer of the input data Di to the page buffer/sense circuit 160 and to the ECC circuit 120 is substantially finished at the same time. When the data transfer is finished, the ECC circuit 120 performs an ECC calculation to write error-correction symbols (parity bits) generated thereby into a predetermined domain of the page buffer/sense circuit 160. During this period, the transfer circuit 200 doesn't transfer the input data Di from the page buffer/sense circuit 160 to the ECC circuit 120.

When the writing of the error-correction symbol generated by the ECC circuit 120 into the page buffer/sense circuit 160 is finished, the input data Di held by the page buffer/sense circuit 160 and 1 page of data of the error-correction symbols are programmed into a selected page in the memory array 100.

On the other hand, in the readout operation, the data read out from the page selected from the memory array 100 is transferred to the page buffer/sense circuit 160. Next, the data held in the page buffer/sense circuit 160 is transferred to the ECC circuit 120 by the transfer circuit 200. The ECC circuit 120 determines whether there is programming defect or readout defect according to the error-correction symbols. If there is any error due to the above defects, the error-correction symbols are used to correct the data. The data gone through the ECC process is transferred to the page buffer/sense circuit 160 again via the transfer circuit 200, and then output to the outside via the input/output buffer 110.

In the embodiment, in the programming operation, the data input from the external input/output terminal is loaded into the page buffer/sense circuit 160 and the ECC circuit 120 in parallel. Therefore, in actual fact the transfer operation of data from the page buffer/sense circuit 160 to the ECC circuit 120 is omitted, so that the time required for programming is substantially reduced.

Figure 7:
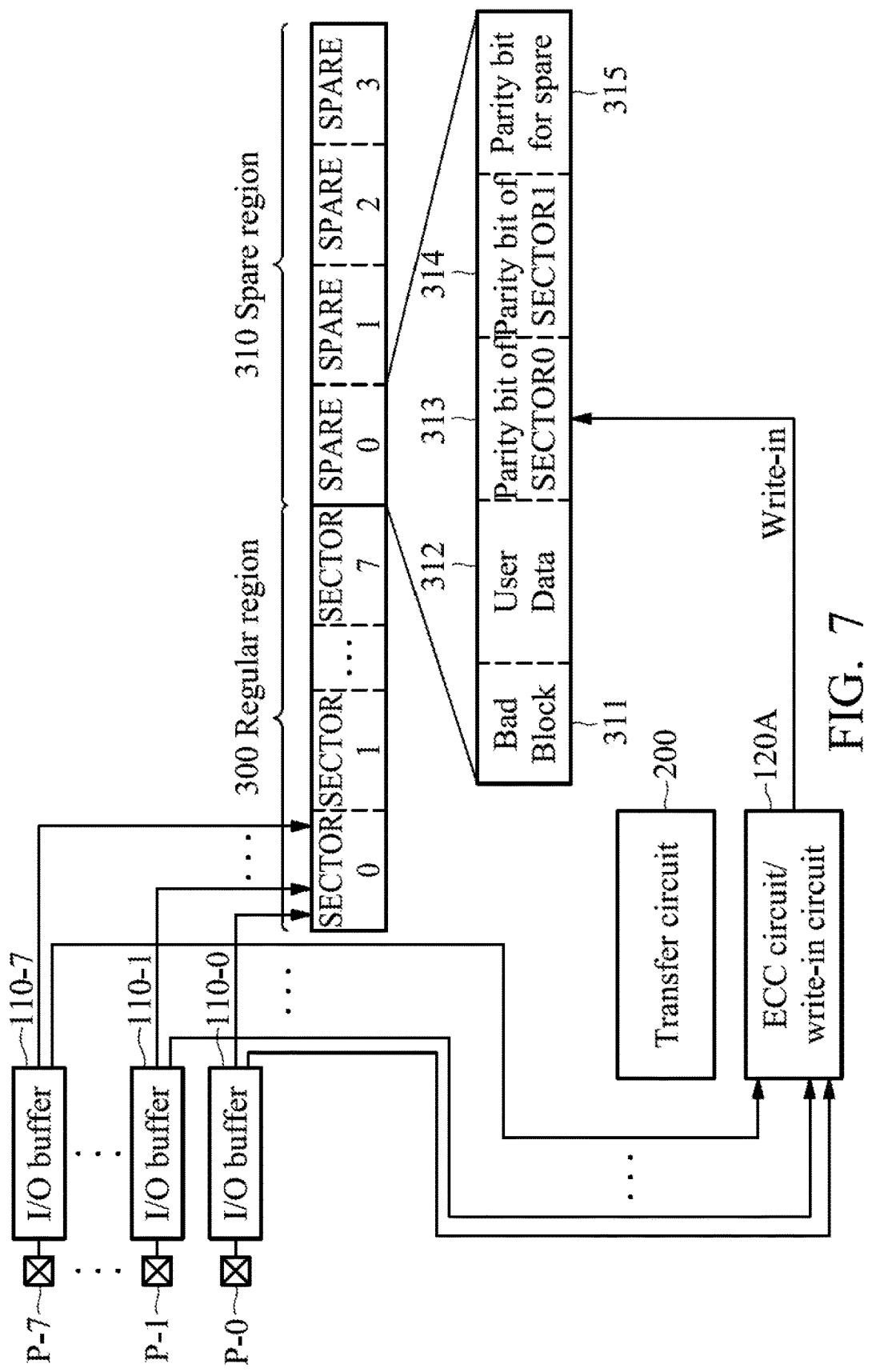
FIG. 7 is a diagram for illustrating an ECC process for data of a regular domain in accordance with an embodiment of the invention.

Next, a better aspect of the embodiment is described in reference to FIGS. 7-11. The external input/output terminal of the flash memory 10 can be a configuration of 1 line, 4 lines, 8 lines, etc. Here, the input data processing in the programming operation is described in the case where the flash memory 10 has an external input/output terminal with a configuration of 8 lines. As shown in FIG. 7 the external input/output terminals P0~P7 are connected to the input/output buffers 110-0~110-7 respectively. In the programming operation, the data input to the external input/output terminal P0~P7 is input to the input/output buffers 110-0~110-7 in parallel.

The page buffer/sense circuit 160 includes a regular domain 300 divided into 8 sectors: SECTOR0~SECTOR7, and a spare domain 310 divided into 4 sectors: SPARE0, SPARE 1, SPARE2, and SPARE3.

A sector of the regular domain 300 is formed from, for example, 256 bytes. In this case, 8 sectors of the regular domain 300 can hold a total of 2K bytes of programming data. A sector of the spare domain 310 is formed from, for example, 16 bytes. In this case, 4 sectors (SPARE0~SPARE3) can hold a total of 64 bytes of data. A sector of the spare domain 310 includes: an domain 311 which is used to store the data for identifying bad blocks having bad memory elements, a region 312 which is used to store information related to user data, domains 313 and 314 which are used to store the error-correction symbols (parity bits) associated with 2 sectors of the regulator 300, and an domain 315 which is used to store the error-correction symbol (parity bit) after the spare domain 310 is ECC calculated. The domains 313 and 314 of the sector SPARE0 of the spare domain 310 store the error-correction symbols (parity bits) of SECTOR0 and SECTOR1 of the regular domain 300 respectively. The domains 313 and 314 of the sector SPARE1 of the spare domain 310 store the error-correction symbols (parity bits) of SECTOR2 and SECTOR3 of the regular domain 300 respectively. Similarly, the domains 313 and 314 of the sector SPARE2 of the spare domain 310 store the parity bits of SECTOR4 and SECTOR5 of the regular domain 300 respectively. The domains 313 and 314 of the sector SPARE3 of the spare domain 310 store the parity bits of SECTOR6 and SECTOR7 of the regular domain 300 respectively.

Figure 8:
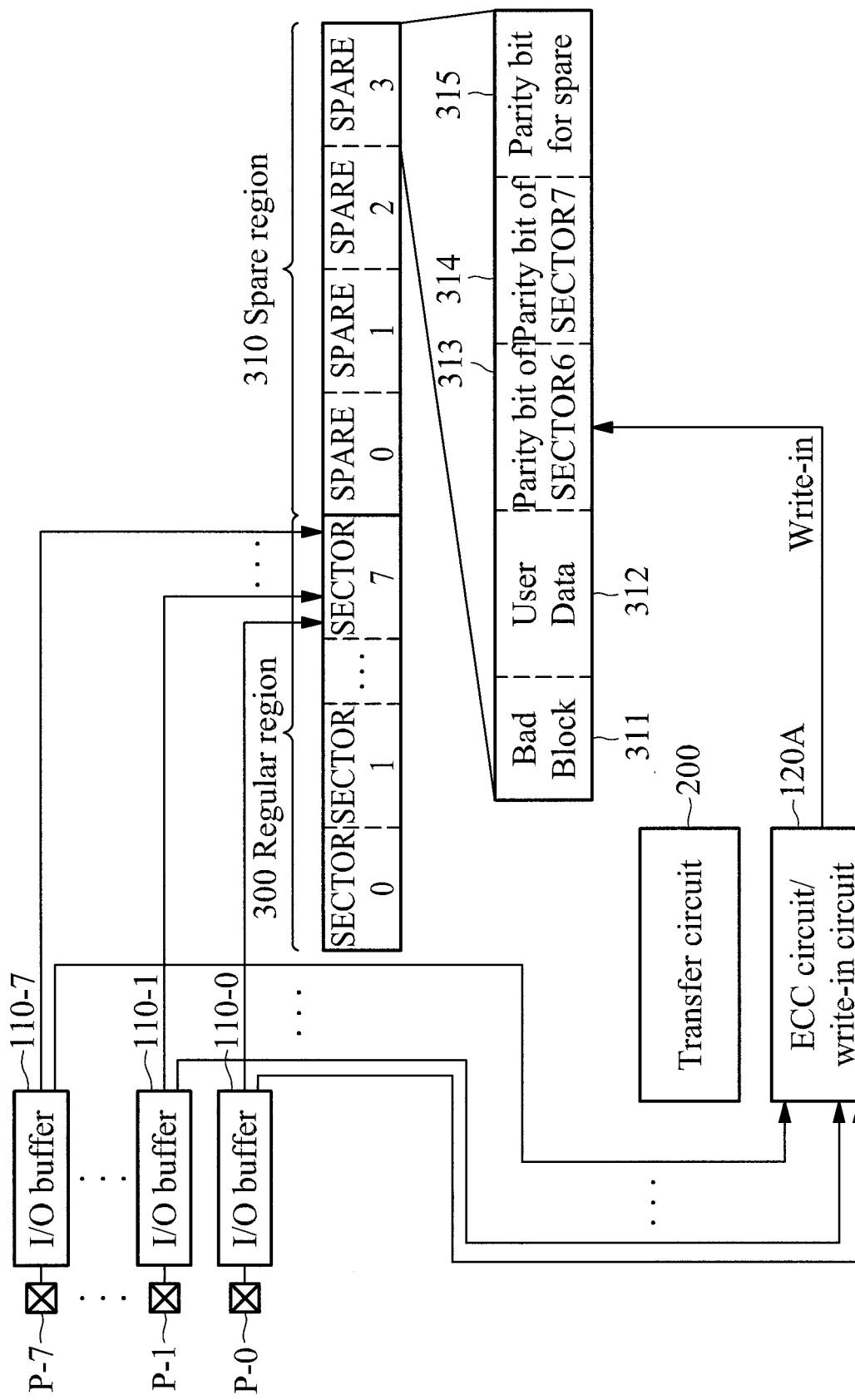
FIG. 8 is a diagram for illustrating an ECC process for data of a regular domain in accordance with an embodiment of the invention.

A sector of the regular domain 300 is assigned for 8 external input/output terminals P-0~P-7, namely, the input/output buffers 110-0~110-7. In other words, one external input/output terminal is assigned with data of 256 bits (256 bits×8=1 sector). The column selection circuit 170 shown in FIG. 2 decodes the column address information Ay received during the programming operation and selects a sector to be loaded with data input to the external input/output terminals P-0~P-7. FIG. 7 shows an example where the data received by the external input/output terminals P-0~P-7 is loaded into SECTOR0 according to the column address information Ay. FIG. 8 shows an example where the data received by the external input/output terminals P-0~P-7 is loaded into SECTOR7 according to the column address information Ay.

In the programming operation, by conducting the switch circuit 114, the input/output buffers 110-0~110-7 output the programming data to the page buffer/sense circuit 160 and an ECC circuit/write-in circuit 120A, respectively. Meanwhile, the driving signal TG is driven to low level and the transfer circuit 200 doesn't transfer the programming data of the regular domain 300.

In this example, the ECC circuit/write-in circuit 120A includes a write-in circuit for writing the error-correction symbols. It is preferred that the ECC circuit can perform ECC calculation for data of which the number of bytes is equal to that of a sector of the regular domain 300. If one sector of the regular domain 300 has 256 bytes, the ECC circuit performs ECC calculation for data of 256 bytes and generates the error-correction symbol thereof.

The ECC circuit/write-in circuit 120A writes the error-correction symbol generated into the corresponding domain 313 or 314 in the spare domain 310. In the example shown in FIG. 7, the programming data Di is loaded into SECTOR0 of the regular domain 300. Thus, the error-correction symbol is written into the domain 313 of SPARE0 which is used for storing the parity bits of the SECTOR0. In the example shown in FIG. 8, the programming data Di is loaded into SECTOR7 of the regular domain 300. Thus, the error-correction symbol is written into the domain 314 of SPARE3 which is used for storing the parity bits of the SECTOR7.

Figure 9:
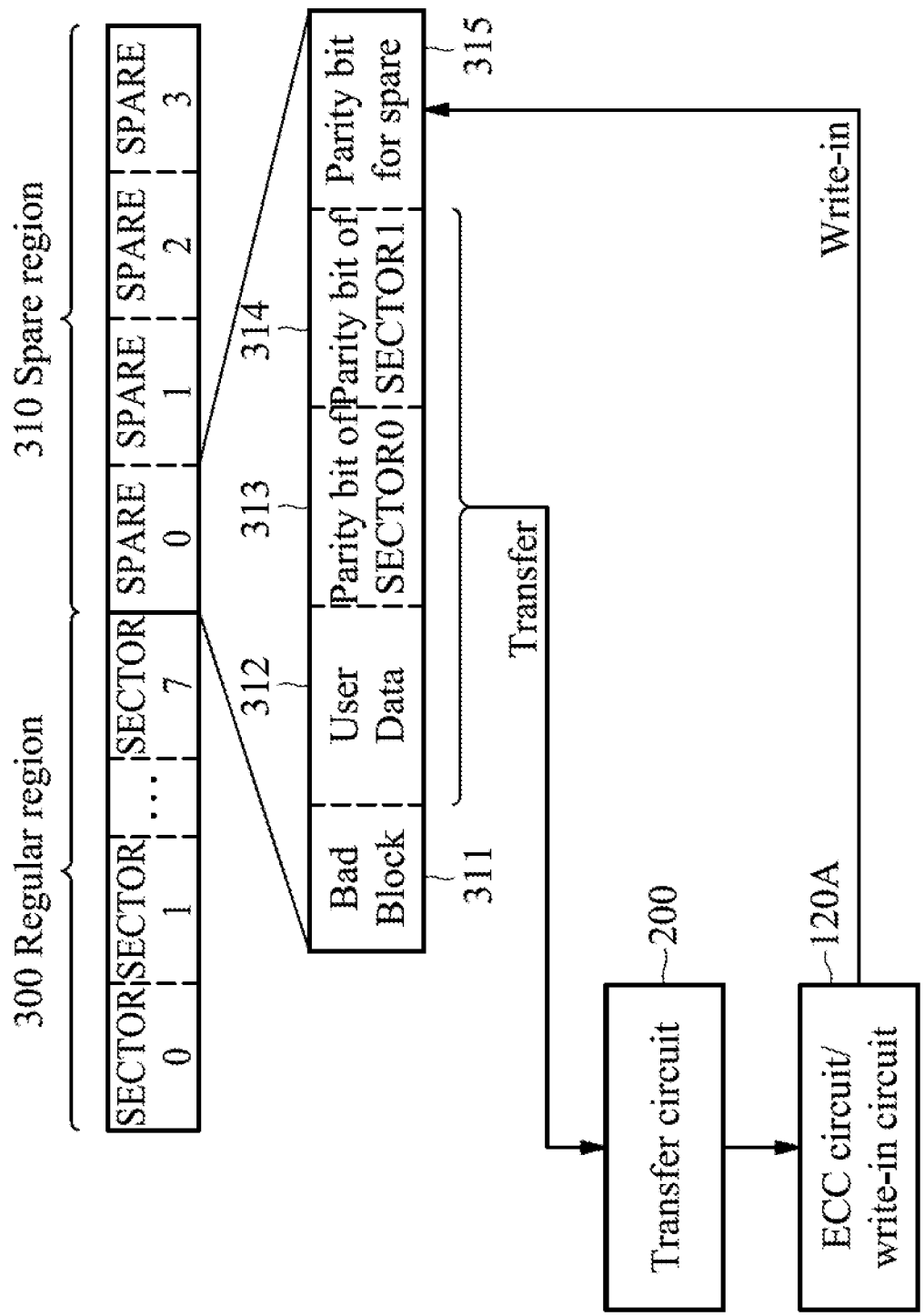
FIG. 9 is a diagram for illustrating an ECC process for data of a spare domain in accordance with an embodiment of the invention.

FIG. 9 shows an example of ECC process for data of the spare region 310. After the ECC process for each sector of the regular domain 300 is finished, the ECC process is performed for each sector for the spare domain 310. It is arbitrary for which data included in a sector of the spare domain 310 the ECC process is performed. However, it is assumed in this example that the ECC process is performed for the domains 312~314. Therefore, the transfer circuit 200 transfers data of the domains 312~314 in SPARE0 to the ECC circuit/write-in circuit 120A. Then, the error-correction symbol generated after the ECC process is written into the domain 315 in SPARE0 by the ECC circuit/write-in circuit 120A. The same process is also performed for SPARE1~SPARE3.

Figure 10:
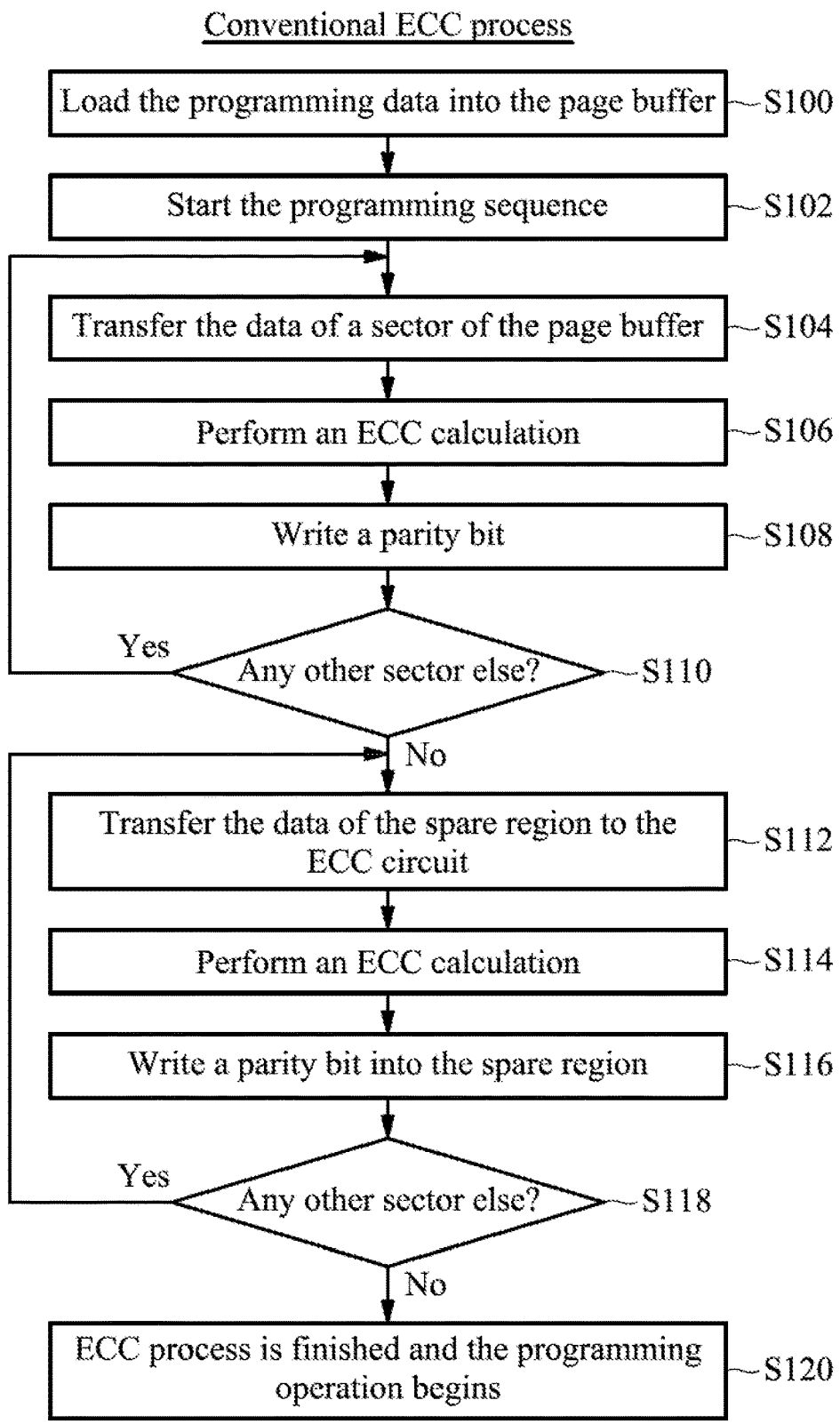
FIG. 10 is a flowchart for illustrating a conventional ECC process when a flash memory performs a programming operation.
Figure 11:
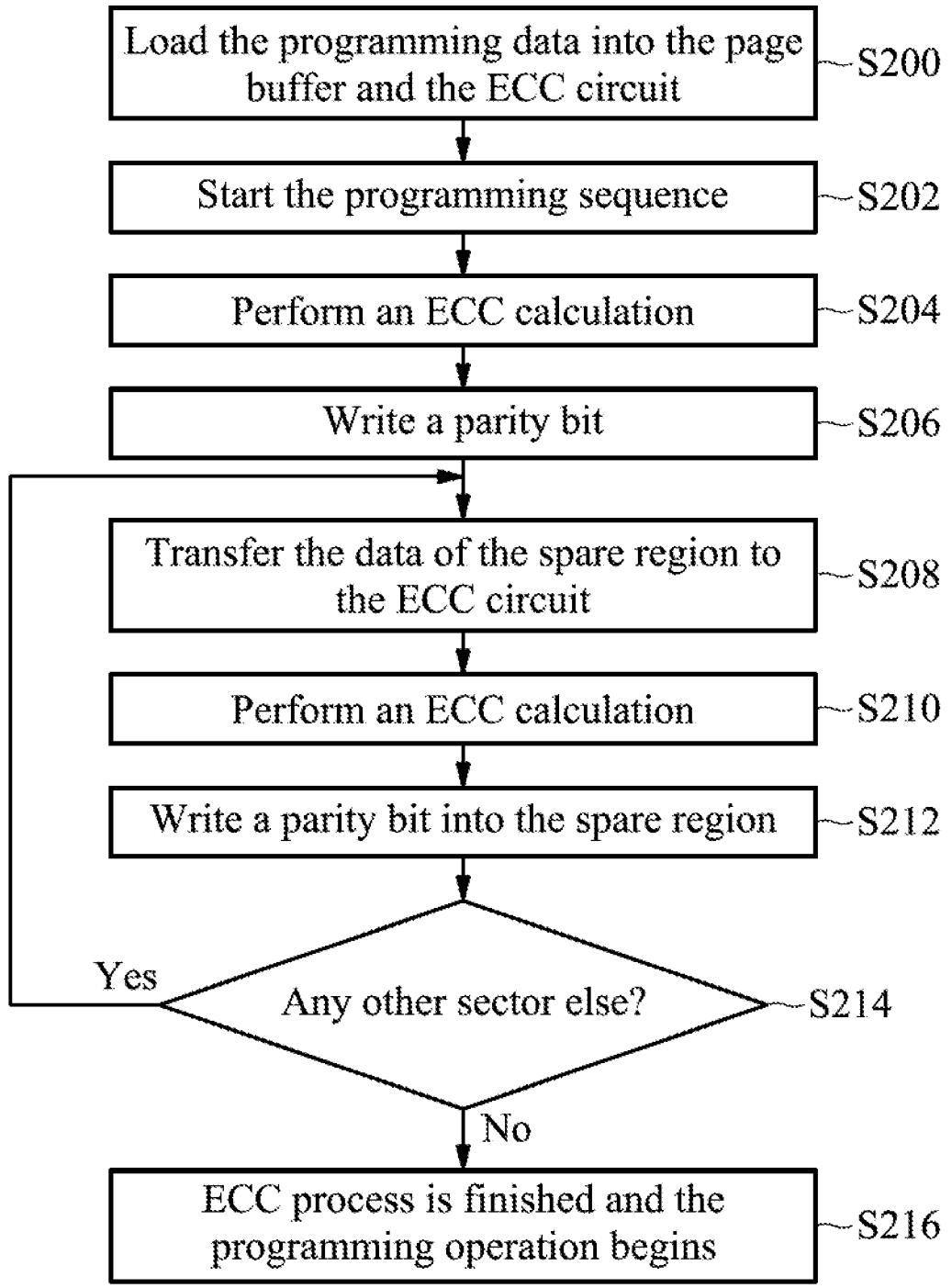
FIG. 11 is a flowchart for illustrating an ECC process when a flash memory performs a programming operation in accordance with an embodiment of the invention.

FIG. 10 is a flowchart showing a conventional ECC process. FIG. 11 is a flowchart showing an ECC process in accordance with the embodiment. First, the conventional ECC process is described. An external controller supplies an external control signal, command data, address data, and programming data to the flash memory 10. The controller 140 begins the programming operation according to the external control signal and the command data.

Once the programming data (input data Di) is loaded to the page buffer/sense circuit 160 via the external input/output terminal and the input/output buffer 110 (S100), the programming sequence starts under the control of the controller 140 (S102). The data held in SECTOR0 of the page buffer/sense circuit 160 is transferred to the ECC circuit 120 (S104). Next, the ECC circuit 120 performs ECC calculation (S106) and writes the generated parity bits into the spare region 310 of the page buffer/sense circuit 160 (S108).

Next, the controller 140 determines if there is any sector not gone through the ECC process (S110). In this way, the data of all sectors of the page buffer/sense circuit 160 is ECC processed, and the parity bits of each sector is written into the domains 313 and 314 of the corresponding sector in the spare region 310. The NAND-type flash memory performs the programming operation in page units, but it is not necessary for the size of the programming data be equal to one page. Namely, it is not necessary for the size of the programming data be equal to the size of 8 sectors of the regular domain 300. For example, the size of the programming data can be the size of a sector. Generally, in view of programming disturbance, the number of programming (NOP) to the same page successively is limited. Data of a page can be divided into several pieces for the programming operation in accordance with the NOP. For example, if NOP is 4, data of a page can be divided into 2 sectors, 1 sector, 3 sectors, and 2 sectors to be input to the flash memory 10.

Once the ECC process for the regular domain is finished, the ECC process for the spare domain is performed. As shown in FIG. 9, the data of SPARE0 in the spare region 310 is transferred to the ECC circuit/write-in circuit 120A via the transfer circuit 200 (S112). After the ECC calculation is performed here (S114), the generated parity bits are written into the domain 315 of SPARE0 via the write-in circuit (S116). Whether there is any sector not gone through the ECC process is determined (S118). If yes, steps S112~S116 are repeated. In this way, the data of all sectors of the spare region 310 is ECC processed. Once the ECC process for all data held in the regular domain 300 and the spare domain 310 of the page buffer/sense circuit 160 is finished, the data held in the page buffer/sense circuit 160 is loaded into a page selected in the memory array.

On the other hand, regarding the flash memory 10 in accordance with the embodiment, as shown in FIG. 11, the programming data is loaded into the page buffer/sense circuit 160 and the ECC circuit/write-in circuit 120A (S200). After the loading, the programming sequence starts (S202).

Once the loading of the programming data is finished, the ECC circuit/write-in circuit 120A performs the ECC process (S204) and the generated parity bits are written into the domain 313 of the spare domain 310 via the ECC circuit/write-in circuit 120A. Assuming that the loading of the programming data is started from SECTOR0 and ended to SECTOR7, the ECC calculation for the programming data from SECTOR0 to SECTOR 7 is performed successively, and the generated parity bits are written into the domain 313 or 314 of the corresponding sector in the spare domain 310.

Once the input of the programming data from the external input/output terminal is finished, the ECC process for SPARE0 of the spare domain 310 is performed. The ECC process for the spare domain 310 is the same as the conventional method shown in FIG. 10, so the description is omitted.

According to the embodiment, in the programming operation, the programming data input from the external input/output terminal is loaded into both of the page buffer/sense circuit 160 and the ECC circuit/write-in circuit 120A, so the transfer operation of the programming data from the page buffer/sense circuit 160 to the ECC circuit/write-in circuit 120A becomes unnecessary, and the time required for that operation can be reduced. Therefore, the time when ECC process for the programming data begins can be shifted earlier. As a result, the time required for programming the programming data to a selected page can be shortened.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor memory device, comprising
a memory array,
a page buffer for holding a page of data read out from the memory array or a page of data to be written into the memory array,
an input element,
an error checking and correcting element for performing error checking and correcting for data,
a supply element including a switch circuit, wherein the switch circuit is enabled for supplying the data to be written into the memory array from the input element to the page buffer and the error checking and correcting element in parallel during a programming operation, while the switch circuit is disenabled to isolate the supply element from the error checking and correcting element during a readout operation, and
a data transfer element arranged between the page buffer and the error checking and correcting element, wherein the data transfer element includes a plurality of transfer transistors commonly supplied with a driving signal,
a write-in element for writing error-correction symbols into the page buffer via the data transfer element when the programming operation is performed, wherein the error-correction symbols are generated by the fact that the error checking and correcting element processes the data from the supply element,
wherein when the programming operation is performed, the driving signal is driven to low level, and the data transfer element doesn't transfer a regular domain of the data to be written into the memory array between the page buffer and the error checking and correcting element,
wherein when the readout operation is performed, the data read out from the memory array is transferred from the page buffer to the error checking and correcting element via the data transfer element, and the data read out from the memory array is processed by the error checking and correcting element and transferred to the page buffer via the data transfer element.

2. The semiconductor memory device as claimed in claim 1, further comprising:
a programming element for programming the data held in the page buffer into the memory array after the error-correction symbols are written into the page buffer.

3. The semiconductor memory device as claimed in claim 2, wherein before the write-in element writes the error-correction symbols into the page buffer via the data transfer element, the transfer of the data to be written into the memory array from the input element to the page buffer and the error checking and correcting element is substantially finished at the same time.

4. The semiconductor memory device as claimed in claim 1, wherein when the page buffer is divided into a plurality of sectors, the supply element supplies data in sector units to the error checking and correcting element, and the error checking and correcting element performs error checking and correcting for the data in sector units.

5. The semiconductor memory device as claimed in claim 1, further comprising:
a control element for controlling the programming operation and the readout operation according to an external command.

6. The semiconductor memory device as claimed in claim 5, wherein the data transfer element is controlled by the control element.

7. The semiconductor memory device as claimed in claim 1, wherein the memory array is a NAND-type memory array.

8. A method of operating a NAND-type flash memory, comprising:
a programming operation, comprising:
enabling a switch circuit of a supply element;
loading programming data input from an external terminal into a page buffer configured to be capable of holding a page size of data and an error checking and correcting circuit in parallel by the supply element;
associating error-correction symbols generated by the error checking and correcting circuit with the programming data and writing them into the page buffer via a transfer circuit arranged between the page buffer and the error checking and correcting element, wherein the data transfer element includes a plurality of transfer transistors commonly supplied with a driving signal;
driving the driving signal to low, and not allowing the transfer of a regular domain of the programming data between the page buffer and the error checking and correcting element; and
programming the programming data and the error-correction symbols held in the page buffer into a page selected in a memory array of the NAND-type flash memory, and
a readout operation, comprising:
disenabling the switch circuit of the supply element to isolate the supply element from the error checking and correcting element;
transferring readout data from the page selected from the memory array to the page buffer;
transferring the readout data held in the page buffer to the error checking and correcting element via the transfer circuit;
transferring the readout data processed by the error checking and correcting element to the page buffer via the transfer circuit; and
outputting the readout data processed by the error checking and correcting element and then held in the page buffer to the external terminal.

9. The method as claimed in claim 8, further comprising:
determining whether an operation to be performed is the programming operation or the readout operation according to an external command, and
when the operation to be performed is the programming operation, loading the programming data input from the external terminal to the error checking and correcting circuit.

* * * * *